United States Patent [19]

Arthur et al.

[11] Patent Number: 5,024,871
[45] Date of Patent: Jun. 18, 1991

[54] CERAMIC FILLED FLUOROPOLYMETRIC COMPOSITE MATERIAL

[75] Inventors: David J. Arthur, Norwood; Gwo S. Swei, Northboro, both of Mass.

[73] Assignee: Rogers Corporation, Rogers, Conn.

[21] Appl. No.: 483,501

[22] Filed: Feb. 21, 1990

[51] Int. Cl.$^5$ ............................................. B32B 9/00
[52] U.S. Cl. .................................... 428/209; 428/323; 428/331; 428/357; 428/421; 428/501; 361/397
[58] Field of Search ............... 428/209, 323, 331, 357, 428/421, 901; 361/397; 174/68.5

[56] References Cited

U.S. PATENT DOCUMENTS 4,331,970 5/1982 Yerman .................................. 357/72
4,849,284 7/1989 Arthur et al. ....................... 428/331

OTHER PUBLICATIONS

CA 92(6):42832c Piezoelectric Polymer Composites Sheets, Wippon T&T 9-19-79.

*Primary Examiner*—Patrick J. Ryan
*Attorney, Agent, or Firm*—Fishman, Dionne & Cantor

[57] ABSTRACT

A composite material is presented comprised of a ceramic filled fluoropolymer wherein the ceramic is coated with a zirconate coupling agent and/or a titanate coupling agent.

28 Claims, 1 Drawing Sheet

CERAMIC FILLED FLUOROPOLYMETRIC COMPOSITE MATERIAL

BACKGROUND OF THE INVENTION

This invention relates to a fluoropolymeric composite material. More particularly, this invention relates to a fluoropolymeric composite material which is particularly well suited for use as a circuit board substrate material or as a bonding ply in a multilayer circuit board and in other applications requiring the ability to flow as well as good thermal, mechanical and electrical properties.

This application is related to U.S. application Ser. No. 483,502 (filed contemporaneously with this application) entitled DIELCTRIC COMPOSITE and invented by David J. Arthur, Gwo S. Swei and Phong X. Nguyen.

U.S. Pat. No. 4, 849,284 which is assigned to the assignee hereof and incorporated herein by reference describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability.

The ceramic filled fluoropolymer-based electrical substrate material of U.S. Pat. No. 4,849,284 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated throughhole reliability. As is known, individual sheets of this electrical substrate material may be stacked to form a multilayer circuit board. In fact, thin film formulations of the material disclosed in U.S. Pat. No. 4,894,284 (and sold by Rogers Corporation under the trademark RO-2810) may be used as a bonding ply to bond together a plurality of stacked substrate layers so as to form the multilayer circuit board.

While the silane coating provides significant and unexpected features and excellent properties to the electrical substrate material of U.S. Pat. No. 4,849,284, there is nevertheless a perceived need to utilize additional and perhaps less costly filler coatings which would provide the same or better results as does the silane.

SUMMARY OF THE INVENTION

It has now been discovered that the silane coatinq on the ceramic filler of the electrical substrate material disclosed in U.S. Pat. No. 4,849,284 may be replaced with zirconate coupling agents and/or titanate coupling agents and the resultant composite material will still retain the excellent thermal, mechanical and electrical properties as that described in U.S. Pat. No. 4,849,284. Accordingly, the present invention comprises a ceramic filled fluoropolymer composite wherein the ceramic filler is coated with zirconate and/or titanate coupling agents.

The discovery in U.S. Pat. No. 4,849,284 relating to the excellent physical, thermal and electrical properties provided by the silane coating as both significant and unexpected. Similarly, the discovery that zirconate and titanate coatings will provide results approaching, if not equal to, those associated with silane is also surprising and unexpected.

The above-discussed and other features and advantages of the present invention will be appreciated and understood by those of ordinary skill in the art from the following detailed description and drawings.

BRIEF DESCRIPTION OF THE DRAWING

Referring now to the drawings

DESCRIPTION OF THE PREFERRED EMBODIMENT

Figure 1:
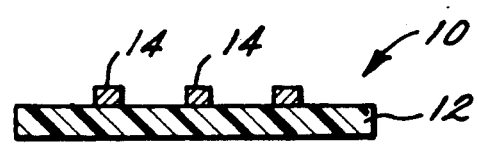
FIG. 1 is a cross-sectional elevation view of a printed wiring board in accordance with the present invention.

The ceramic filled fluoropolymeric composite of the present invention is substantially similar to the composite described in U.S. Pat. No. 4,849,284 (which has been fully incorporated herein by reference) with the exception that the ceramic is coated with a zirconate and/or titanate coating rather than a silane coating. Thus, in a preferred embodiment, the present invention comprises a composite of particulate ceramic filler present at a volume fraction of at least about 50% (or a weight fraction of at least about 55%) and fluoropolymer (e.g., PTFE). The preferred ceramic filler is fused amorphous silica, however other particulate siliceous fillers such as sand and clay may be used. In addition, reinforcement material such as fiberglass, solid glass beads and bulk glass panels in amounts of equal to or less than 2% (by weight) may be used. As mentioned, all other compositional features and methods of manufacture are the same as that disclosed in U.S. Pat. No. 4,849,284 (excluding the ceramic being coated with a silane). Accordingly, reference is to be made to U.S. Pat. No. 4,849,284 for those details.

Suitable zirconate coupling agents include, but are not limited to neopentyl(diallyloxy)tri(dioctyl) pyrophosphate zirconate and neopentyl(diallyoxy)tri(N-ethylenediamino) ethyl zirconate which is available from Kenrich Petrochemicals, Inc. under the tradename LZ-44.

Suitable titanate coupling agents include neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate; all of which are available from Kenrich Petrochemicals, Inc. under the tradename LICA.

Preferred zirconate and titanate coating for effecting the important features associated with the electrical substrate material of this invention is 1% by weight of the filler (ceramic) material.

EXAMPLES

Several samples of composite material were made in accordance with the manufacturing methods described in U.S. Pat. No. 4,849,284. All of the samples included 40% (by volume) of polytetrafluoroethylene and 60% (by volume) coated filler. The filler comprised fused amorphous silica particles having an average diameter of five (5) microns. The zirconate coupling agent utilized was LZ-44 described above. The samples contained 0.005% LZ-44 (by weight) and 1% LZ-44 (by weight) in an isopropanol solution. The samples were tested for mechanical, electrical and thermal properties as well as water absorption and were compared to a control sample having no coating on the silica filler particles. The results are set forth in Table 1 below in the form of averaged data:

zirconate or titanate ceramic filler coatings) are used as an adhesive or bond ply to laminate individual circuit substrates together. In a preferred method of forming such a laminate, a stack-up of circuit substrates altered with one or more layers of the bond ply is made. This stack-up is then fusion bonded whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane coated ceramic filled fluoropolymer of either this invention or U.S. Pat. No. 4,849,284. Although, in a

TABLE 1

| MATERIAL | THICK-NESS | SP G | Dk 10 GHz | tan d 10 GHz | $H_2O$ 48 Hrs. | MODULUS (Kpsi) | TENSILE STRENGTH (Kpsi) | % ELONG. | FLEX MODULUS (Kpsi) | FLEX YIELD (psi) |
|---|---|---|---|---|---|---|---|---|---|---|
| .005% LZ-44 in Isopropanol | .0555" | 1.87 | 2.67 | 0.0058 | 2.81 | 86.8 | 0.633 | 14.18 | 167.4 | 1144.9 |
| 1% LZ-44 in Isopropanol | .0528" | 1.87 | 2.65 | 0.0037 | 1.53 | 115.6 | 0.62 | 10.05 | 408.5 | 1303.2 |
| Uncoated | .0546" | 1.89 | $2.73^1$ $4.86^2$ | $0.0033^1$ $0.003^2$ | 3.16 | 29.25 | 0.447 | 12.29 | 101.2 | 653 |

[1] Measured just after baking for 2 hours at 150° C.
[2] Measured subsequent to baking for 2 hours at 150° C. and exposure to ambient conditions for two days As is clear from a review of Table 1, the zirconate coated composite material exhibits reduced water absorption and increased flexural modulus (relative to the control sample) by 400% (in the 1% LZ-44 sample). The composite of this invention also exhibited increased flex yield, tensile strength and modulus. The electrical properties were also improved as is clear from the comparison between Dk and tan d after several days exposure to ambient conditions. Moreover, the zirconate coated composites provided a "semi-rigid" substrate which may be even more resistant to compressive creep than the silane coated composites of U.S. Pat. No. 4,849,284.

The composite of this invention is well suited for use as an electrical substrate material and/or as a bonding ply used in multilayer circuit boards. Referring to FIG. 1, a circuit board is shown generally at 10 having a substrate 12 comprised of the highly filler fluoropolymeric composite of this invention wherein the filler particles are coated with a zirconate and/or titanate coupling agent. A plurality of electrical conductors 14 (e.g. aluminum, steel, copper or metal alloys) are disposed on substrate 12.

Figure 2:
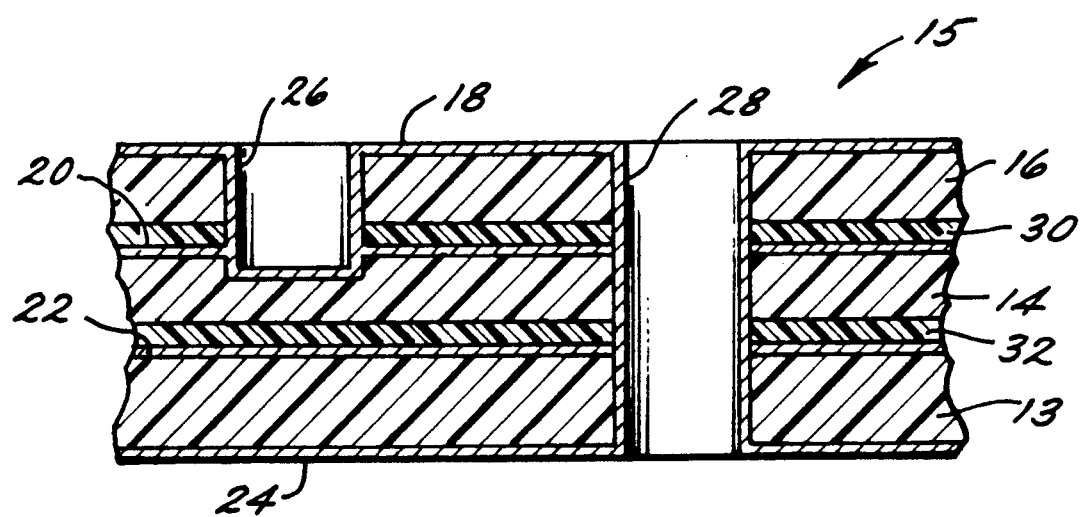
FIG. 2 is a cross-sectional elevation view of a multilayer circuit board employing the thermoplastic composite material in accordance with the present invention as a thin film bonding ply.

In addition and referring to FIG. 2, the composite of this invention may be processed into a sheet in its undensified, unsintered form and used for bonding multilayer printed wiring boards. Turning now to FIG. 2, such a multilayer circuit board is shown generally at 15. Multilayer board 10 comprises a plurality of layers of substrate material 13, 14 and 16, all of which are comprised of an electrical substrate material, preferably the ceramic filled fluoropolymeric material of U.S. Pat. No. 4,849,284 sold under the RO-2800 trademark or the fluoropolymeric composite (e.g., zirconate or titanate coated ceramic) of this invention. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention (e.g., preferred embodiment, a multilayer circuit board includes circuit substrates which are all comprised of the electrical substrate material of U.S. Pat. No. 4,849,284.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate material comprising:
   fluoropolymeric material;
   silaceous ceramic filler material, said filler material being in an amount of at least about 50 volume percent of the total substrate material; and
   said ceramic filler being coated by a zirconate coating.

2. The material of claim 1 including:
   at least one layer of conductive material being disposed on at least a portion of said electrical substrate material.

3. The material of claim 1 wherein said fluoropolymeric material is selected from the group comprising:
   polytetrafluoroethylene, hexa fluoropropene, tetrafluoroethylene or perfluoro alkyl vinyl ether.

4. The material of claim 1 wherein said ceramic filler comprises silica.

5. The material of claim 4 wherein said silica comprises amorphous fused silica powder.

6. The material of claim 1 wherein said zirconate coating is selected from the group comprising:
   neopentyl(diallyloxy)tri(dioctyl) pyro-phosphate zirconate and neopentyl(diallyoxy)tri(N-ethylenediamino) ethyl zirconate.

7. The material of claim 1 wherein said ceramic filler comprises particles and wherein the mean particle size varies from about 10 to 15 μm.

8. In a multilayer circuit including at least a first circuit layer and a second circuit layer, the improvement comprising:

an adhesive layer sandwiched between the first and second circuit layers, said adhesive layer comprising:

fluoropolymeric material;

silaceous ceramic filler material, said filler material being in an amount of at least about 50 volume percent of the total adhesive layer; and said ceramic filler being coated with a zirconate coating.

9. The multilayer circuit of claim 8 including:

at least one plated through hole.

10. The multilayer circuit of claim 8 wherein said fluoropolymeric material is selected from the group comprising:

polytetrafluoroethylene, hexa fluoropropene, tetrafluoroethylene or perfluoro alkyl vinyl ether.

11. The multilayer circuit of claim 8 wherein said ceramic filler comprises silica.

12. The multilayer circuit of claim 11 wherein said silica comprises amorphous fused silica powder.

13. The multilayer circuit of claim 8 wherein said silane coating is selected from the group comprising:

neopentyl(diallyloxy)tri(dioctyl) pyro-phosphate zirconate and neopentyl(diallyoxy)tri(N-ethylenediamino) ethyl zirconate.

14. The multilayer circuit of claim 8 wherein said ceramic filler comprises particles and wherein the mean particle size varies from about 10 to 15 $\mu$m.

15. An electrical substrate material comprising:

fluoropolymeric material;

silaceous ceramic filler material, said filler material being in an amount of at least about 50 volume percent of the total substrate material; and said ceramic filler being coated by a titanate coating.

16. The material of claim 15 including:

at least one layer of conductive material being disposed on at least a portion of said electrical substrate material.

17. The material of claim 15 wherein said fluoropolymeric material is selected from the group comprising:

polytetrafluoroethylene, hexa fluoropropene, tetrafluoroethylene or perfluoro alkyl vinyl ether.

18. The material of claim 15 wherein said ceramic filler comprises silica.

19. The material of claim 18 wherein said silica comprises amorphous fused silica powder.

20. The material of claim 15 wherein said zirconate coating is selected from the group comprising:

neopantyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

21. The material of claim 15 wherein said ceramic filler comprises particles and wherein the mean particle size varies from about 10 to 15 $\mu$m.

22. In a multilayer circuit including at least a first circuit layer and a second circuit layer, the improvement comprising:

an adhesive layer sandwiched between the first and second circuit layers, said adhesive layer comprising:

fluoropolymeric material;

silaceous ceramic filler material, said filler material being in an amount of at least about 50 volume percent of the total adhesive layer; and said ceramic filler being coated with a titanate coating.

23. The multilayer circuit of claim 22 including:

at least one plated through hole.

24. The multilayer circuit of claim 22 wherein said fluoropolymeric material is selected from the group comprising:

polytetrafluoroethylene, hexa fluoropropene, tetrafluoroethylene or perfluoro alkyl vinyl ether.

25. The multilayer circuit of claim 22 wherein said ceramic filler comprises silica.

26. The multilayer circuit of claim 25 wherein said silica comprises amorphous fused silica powder.

27. The multilayer circuit of claim 22 wherein said silane coating is selected from the group comprising:

neopentyl(diallyl)oxy, trineodecanonyl titanate, neopentyl(diallyl)oxy, tri(dodecyl)benzene-sulfonyl titanate, neopentyl(diallyl)oxy, tri(dioctyl)phosphato titanate, neopentyl(diallyl)oxy, tri(dioctyl)-pyro-phosphato titanate, neopentyl(diallyl)oxy, tri(N-ethylenediamino) ethyl titanate, neopentyl(diallyl)oxy, tri(m-amino)phenyl titanate, and neopentyl(diallyl)oxy, trihydroxy caproyl titanate.

28. The multilayer circuit of claim 22 wherein said ceramic filler comprises particles and wherein the mean particle size varies from about 10 to 15 $\mu$m.

* * * * *